United States Patent
Powers

(10) Patent No.: US 6,613,988 B2
(45) Date of Patent: Sep. 2, 2003

(54) CIRCUIT BOARD SYSTEM WITH RAISED INTERCONNECTS OF CONDUCTIVE CIRCUIT TRACES

(76) Inventor: Dirk Powers, 11101 Champions La., Austin, TX (US) 78747

( * ) Notice: Subject to any disclaimer, the term of this patent is extended or adjusted under 35 U.S.C. 154(b) by 65 days.

(21) Appl. No.: 09/938,127

(22) Filed: Aug. 23, 2001

(65) Prior Publication Data

US 2003/0037961 A1 Feb. 27, 2003

(51) Int. Cl.[7] .................................................. H05K 1/11
(52) U.S. Cl. ........................ 174/261; 174/255; 174/254; 257/666
(58) Field of Search .............................. 174/260, 254, 174/261, 255; 257/666

(56) References Cited

U.S. PATENT DOCUMENTS

| | | | | |
|---|---|---|---|---|
| 3,072,734 A | | 1/1963 | Fox ............................ | 174/68.5 |
| 3,564,115 A | * | 2/1971 | Gribble et al. ............... | 174/254 |
| 4,420,820 A | * | 12/1983 | Preedy ......................... | 365/105 |
| 4,829,404 A | * | 5/1989 | Jensen ......................... | 361/749 |
| 4,859,806 A | * | 8/1989 | Smith .......................... | 174/261 |
| 5,360,992 A | * | 11/1994 | Lowrey et al. .............. | 257/666 |
| 5,572,409 A | * | 11/1996 | Nathan et al. ............... | 361/806 |
| 5,587,890 A | * | 12/1996 | Happ et al. .................. | 361/826 |
| 5,614,759 A | * | 3/1997 | Vandenheuvel et al. .... | 257/666 |
| 5,654,564 A | * | 8/1997 | Mohsen ....................... | 257/209 |
| 6,108,212 A | * | 8/2000 | Lach et al. .................. | 361/768 |
| 6,150,709 A | * | 11/2000 | Shin et al. ................... | 257/666 |
| 6,424,024 B1 | * | 7/2002 | Shih et al. ................... | 257/667 |

* cited by examiner

*Primary Examiner*—Kamand Cuneo
*Assistant Examiner*—José H. Alcala

(57) ABSTRACT

An improved method for making prototypes as well as finalized circuit boards consisting of terminal pads affixed to a circuit board with raised circuit trace interconnects between the terminal pads. The raised interconnects between the terminal pads are selectively cut and removed to form the remaining circuit board traces.

3 Claims, 4 Drawing Sheets

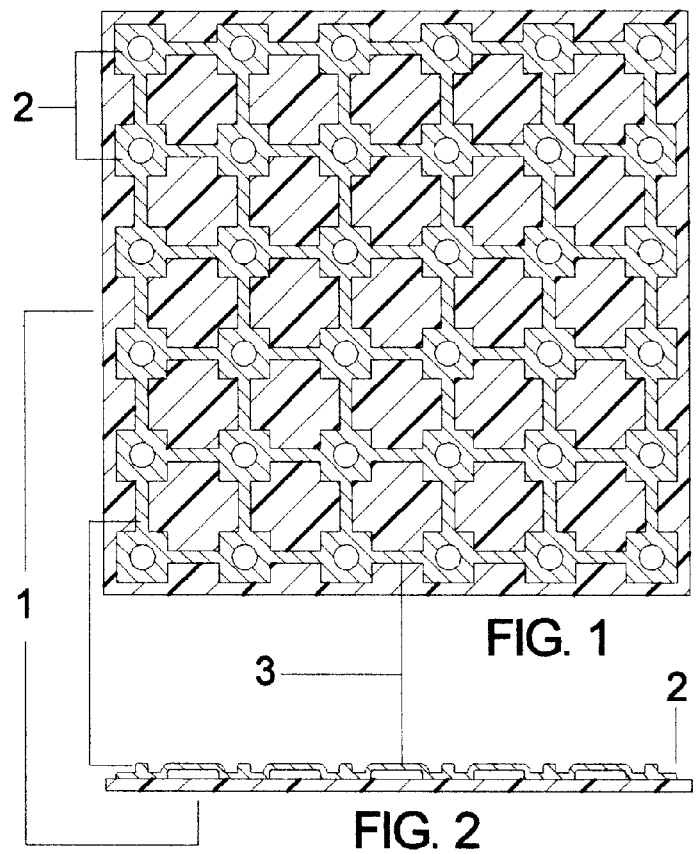
FIG. 1
FIG. 2
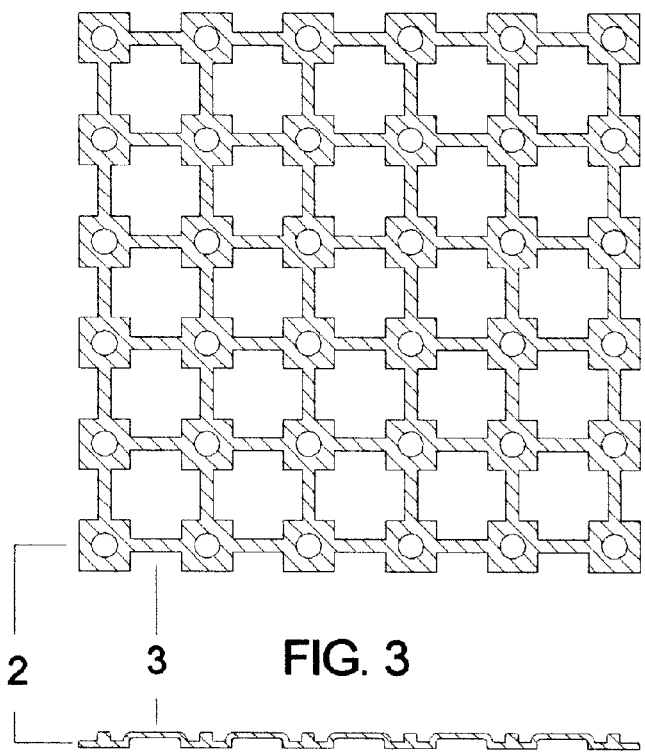
FIG. 3
FIG. 4

CIRCUIT BOARD SYSTEM WITH RAISED INTERCONNECTS OF CONDUCTIVE CIRCUIT TRACES

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A MICROFICHE APPENDIX

Not Applicable

BACKGROUND—FIELD OF INVENTION

The following pages explain and illustrate a very reliable, simple, and effective method of prototyping (creating) electronic circuitry whereas conductor material that interconnects circuit board terminal pads is raised so that it does not adhere to epoxy that affixes the terminal pads to the circuit board. The conductive interconnects (circuit traces) between the terminal pads are selectively cut and removed so that the terminal pad interconnects that are left between the terminal pads form the conductive traces for an electrical circuit. This circuit construction method is also very good for producing finalized permanent circuitry after the prototyping is done (i.e., if the circuit prototype works properly then that same board is ready to be put in the electronic equipment as is).

Typically circuit boards have a 0.002" thick copper plate that is affixed to the board surface with epoxy. These printed circuit boards are then coated with an etchant resist ink where the circuit traces are desired. The copper that is not covered by the etchant resist ink is then removed by an etchant solution such as ferric chloride. The resist ink is then removed with a solvent such as isopropyl alcohol. The copper that remains on the board forms the circuit traces. It usually takes about twenty minutes to etch a 0.002" copper board using ferric chloride once the etchant resist has been applied in the proper pattern. Photo plotting, applying photo resist, using ferric chloride etchant solution and then drilling holes in the circuit board that have the proper standardized electronic component hole spacing, etc., is a time consuming and labor intensive task. However, making reliable permanent circuits using these E-Z CirCut boards with standardized hole spacing is incredibly easy.

Typical perforated boards with standardized hole spacing, with or without a variety of non-removable circuit interconnects are readily available from electronics suppliers such as your local Radio Shack, etc.

Previously, there have been three main methods of prototyping:
1. Jumper wire breadboards with press fit internal sockets.
2. 'Wire wrap' whereas circuits are created by using incredibly thin wire wrapped around extended metal posts.
3. Point-to-point wiring where wiring is simply soldered haphazardly from terminal pad to terminal pad.

In all kindness, all of these previous methods are lousy. Jumper wire breadboards with press fit internal sockets last only a short time before bad connections (everywhere) change their characteristics (especially with analog circuitry). They can't be used with low noise circuitry at all. Bumping the board will cause it to be different than before. Looking at the board will also cause it to be different than before (especially with analog circuitry), etc. Methods 2&3 are almost equally lousy with wiring and, in the case of wire wrapping, bad connections everywhere. It is almost impossible to keep track of the circuitry during construction or to trace it later.

By punching selected standardized spaced holes in a plastic plate and then placing it over alignment posts that fit through a CirCut board a permanent marker can be placed through each hole until the circuit traces (terminal pad interconnects) that are not to be cut are all marked. As such, a large number of identical boards can be marked and then cut quickly and easily.

The advantages of selectively cutting raised removable interconnects between the circuit board terminal pads, other than those already mentioned, is that the boards circuit traces (terminal pad interconnects) can be much thicker. This is due to the fact that in order to be able to reliably etch a printed circuit board the metal must be thin (typically 0.002"). E-Z CirCut boards, on the other hand, do not have this requirement. Therefore, this new board design is better for many high-speed CMOS circuits, for instance. This is due to lower IR (IR is current multiplied by resistance which equals voltage) voltage drops in the circuit due to larger circuit traces (uncut interconnects between the terminal pads), which lowers the circuit resistance. Therefore, voltage spikes caused by a large number of capacitive CMOS gates changing simultaneously are reduced, etc. These CirCut boards are also much better for power circuitry in which, instead of large point to point wiring, the circuit traces for some of these new CirCut boards can, for instance, approximate a ⅛" inch diameter wire and can be doubled by using both sides of the board. In short, there are many reasons why these CirCut boards, in one form or another, are definitely in demand.

It usually takes about twenty minutes to etch a 0.002" copper board using a ferric chloride etching solution, therefore, this E-Z CirCut board design can be very competitive for mass production runs. For instance, it is as easy to mow (cut or trim) a board, as it is to solder it. Besides, photo resist, photo plotting, ferric chloride, etc., must cost something. Also, these boards are digital in nature, not analog like most PC boards. This means that the location of each terminal pad interconnect (circuit trace) can easily be specified digitally since they are all part of a clearly defined grid pattern. For instance, mark interconnects A1to3, 3AtoD, D3to6.

SUMMARY; INCLUDING OBJECTS AND ADVANTAGES

An easy and reliable method for prototyping circuitry and creating solid circuit boards that can be used, as is, in production equipment. These CirCut boards can be double sided and can be produced without "through holes" for use with SMT (surface mount devices). For power circuitry they are ideal since their circuit traces can be much thicker than those of regular circuit boards. The position of each circuit trace (terminal pad interconnect) can be specified according to its grid location. Standard chips fit up above the circuit board (FIG. 11) and the terminal pad interconnects. Therefore, typically, two circuit traces can run underneath each chip (such as a 555 timer chip) between the chips legs. All the standard electronic components are completely compatible with the E-Z CirCut board design. The boards can be single or double sided (more circuit interconnects).

The key to this concept is the raised conductor interconnects between the terminal pads. These stay up off the board away from the epoxy that is used to affix the metal terminal pads of the grid to the circuit board therefore making the terminal pad interconnects (circuit traces) easy to selectively cut and remove.

DRAWING FIGURES

FIG. 1 Shows a new EZ CirCut board with all its traces intact.

FIG. 2 Shows a side view of a new EZ CirCut board with all its traces intact.

FIG. 3 Shows a facing view of a sheet of copper that has been sheared and stamped in the proper pattern.

FIG. 4 Shows a side view of a sheet of copper that has been sheared and stamped in the proper pattern.

REFERENCE NUMERALS IN DRAWINGS

1. E-Z CirCut board.
2. CirCut board terminal pads.
3. Circuit board terminal pad's raised interconnects.
4. Pre-drilled board holes.
5. Copper grid to board alignment posts

DESCRIPTION OF INVENTION

Figure 5:
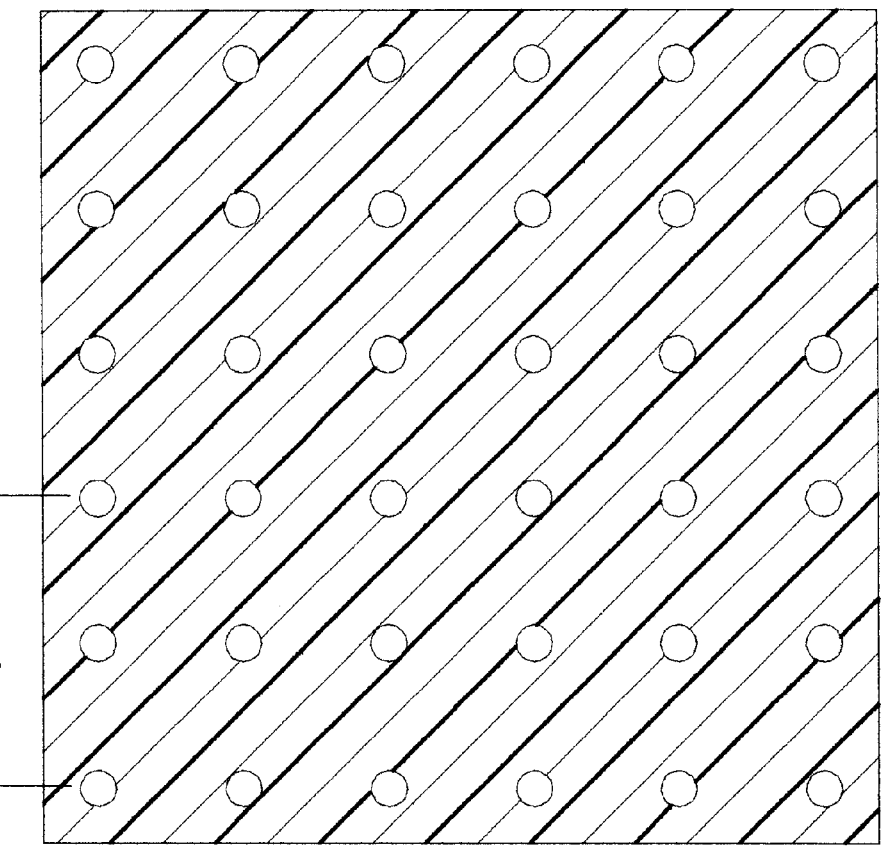
FIG. 5 Shows a facing view of a low conductivity fiberglass board with pre-drilled holes.
Figure 6:
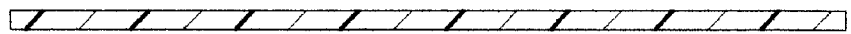
FIG. 6 Shows a side view of a low conductivity fiberglass board with pre-drilled holes.
Figure 7:
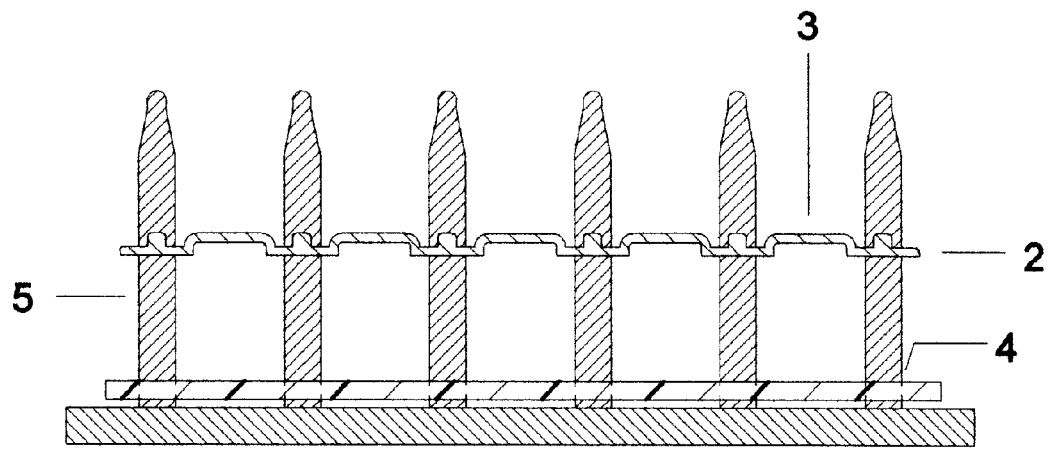
FIG. 7 Shows a simple assembly with copper grid pattern to pre-drilled board alignment posts.
Figures 8, 9, 10, 11:
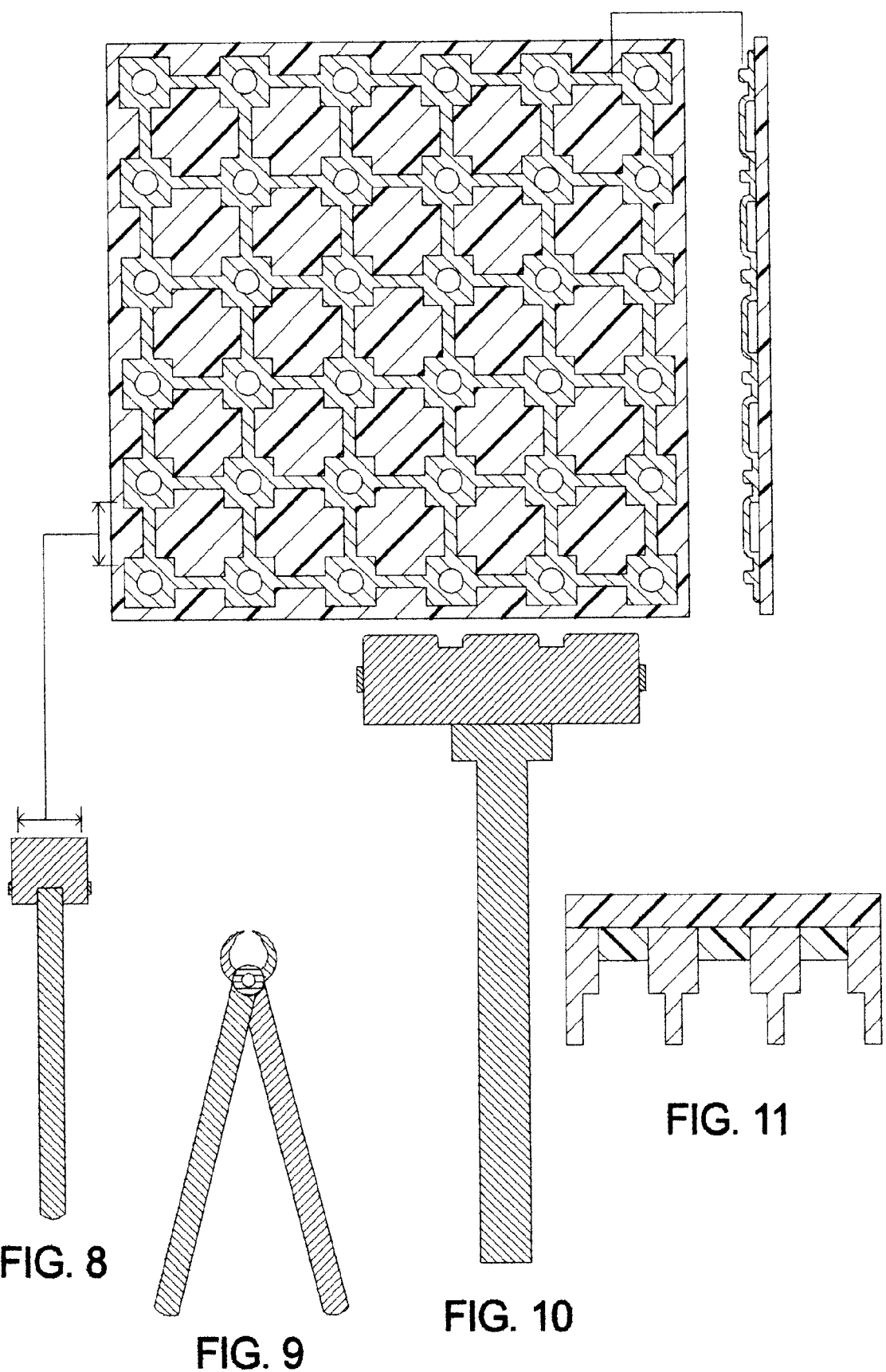
FIG. 8 Shows a partial view of a single raised interconnect board mower (cutter).
FIG. 9 Shows a side view of a single raised interconnect board mower (cutter).
FIG. 10 Shows a multiple (three) raised interconnect board mower (cutter).
FIG. 11 Shows the side view of a standard chip that sits up above the circuit board.
Figure 12:
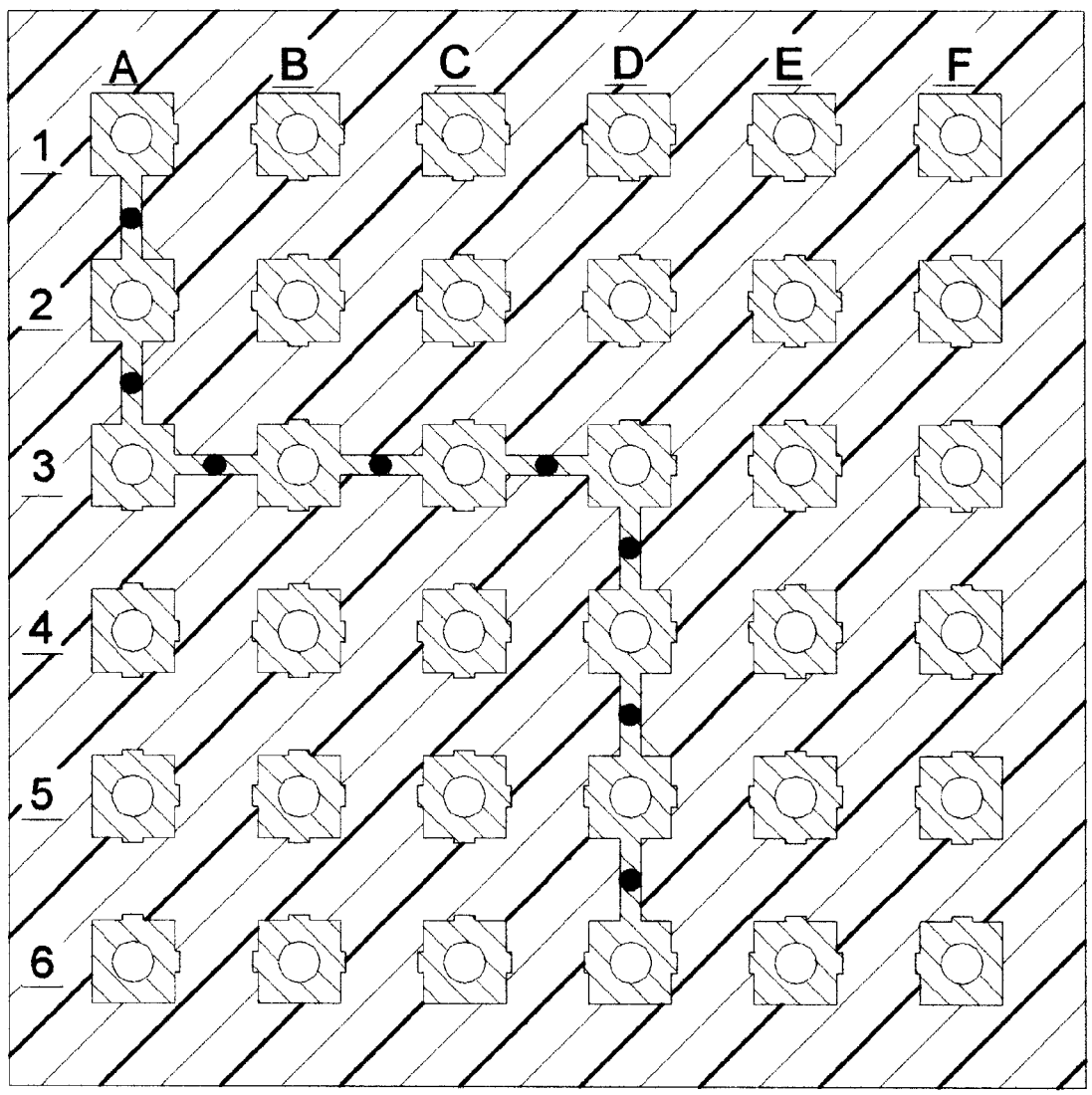
FIG. 12 Shows a board with grid specified interconnects (A1to3,3AtoD,D3to6) marked and the rest of the raised interconnects removed.

A top (or bottom) view of a newly manufactured E-Z CirCut board (1) with terminal pads (2) and raised interconnects (3) between the terminal pads is shown by FIG. 1. A side view of the circuit board (1) is shown by FIG. 2. A sheet of copper is sheared and stamped in the proper pattern (FIG. 3 and 4) so that terminal pads (2) with raised interconnects (3) are formed. A low conductivity fiberglass board (FIGS. 5 and 6) with pre-drilled holes (4) is coated with epoxy and placed over a simple assembly with copper grid pattern to pre-drilled board alignment posts (FIG. 7) The sheared and stamped copper sheet (FIGS. 3 and 4) is pressed down over the copper grid pattern to pre-drilled board alignment posts (5) and affixed to the board. The finished board is sheared into smaller boards.

OPERATION OF INVENTION

Before mowing the board with a manual cutter one can simply draw the circuit traces on the board with, say, a black magic marker. They then cut (mow) all the other traces. After mowing the board they simply remove the black magic marker ink with some isopropyl alcohol and a paper towel. Then the board is simply "stuffed" with components and soldered.

DESCRIPTION AND OPERATION—ALTERNATIVE EMBODIMENTS

Removable interconnects between the circuit board terminal pads can be arranged in a multitude of ways. However, the terminal pad raised interconnect method is preferable from a standpoint of ease of manufacture, use, and end result.

CONCLUSION, RAMIFICATIONS, AND SCOPE OF INVENTION

Clearly, the E-Z circuit board design provides a reliable and easy way of both prototyping circuitry as well as producing finalized circuitry. The coverage of the invention should be discerned by the appended claims and their legal equivalents, rather than by the examples given.

What is claimed is:

1. A circuit board system comprising: a non-conductive substrate; a conductive grid formed from a sheet of conductive material affixed to at least one side of the circuit board substrate by an adhesive; the conductive grid includes terminal pads which have integral interconnects of conductive circuit traces connecting said terminal pads to one another; wherein at least a portion of each of said circuit traces is raised above the substrate surface and clears said adhesive to not become affixed to said circuit board substrate by said adhesive.

2. A circuit board element comprising: a conductive grid formed from a sheet of conductive material including a plurality of terminal pads, said terminal pads having integral interconnects of conductive circuit traces connecting said terminal pads to one another, said terminal pads including bases; a plurality of said circuit traces, said circuit traces are elevated above a plane formed by the bases of said terminal pads, such that they are not affixed to said circuit board.

3. A circuit board element according to claim 2, wherein the bases of said terminal pads are affixed to a non-conductive substrate by an adhesive, wherein said circuit traces being elevated clear said adhesive.

* * * * *